US010666199B2

(12) United States Patent
Sugimoto et al.

(10) Patent No.: US 10,666,199 B2
(45) Date of Patent: May 26, 2020

(54) DETECTOR CIRCUIT

(71) Applicant: Murata Manufacturing Co., Ltd., Kyoto (JP)

(72) Inventors: Yasutaka Sugimoto, Kyoto (JP); Hiroyuki Hirooka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/647,686

(22) Filed: Jul. 12, 2017

(65) Prior Publication Data

US 2018/0019708 A1    Jan. 18, 2018

(30) Foreign Application Priority Data

Jul. 13, 2016    (JP) .................... 2016-138733

(51) Int. Cl.
  *H03K 5/153*    (2006.01)
  *H03F 1/02*    (2006.01)
  *H03G 3/30*    (2006.01)
  *H04B 1/04*    (2006.01)

(52) U.S. Cl.
  CPC ......... *H03F 1/0205* (2013.01); *H03G 3/3042* (2013.01); *H03F 2200/18* (2013.01); *H04B 2001/0416* (2013.01)

(58) Field of Classification Search
  CPC . H03F 1/0205; H03F 2200/18; H03G 3/3042; H04B 2001/0416
  USPC ........................................................ 327/77
  See application file for complete search history.

(56) References Cited

U.S. PATENT DOCUMENTS

| 4,163,196 A | 7/1979 | Hongu |
| 6,300,669 B1 * | 10/2001 | Kinoshita ........... H01L 27/0823 257/566 |
| 7,705,658 B2 | 4/2010 | Yamamoto et al. |
| 2008/0174356 A1 * | 7/2008 | Yamamoto ............. G01R 21/12 327/362 |

FOREIGN PATENT DOCUMENTS

| JP | S53-123650 A | 10/1978 |
| JP | 2001-144660 A | 5/2001 |
| JP | 2007-166101 A | 6/2007 |
| JP | 2007166101 A * | 6/2007 |
| JP | 2008-148214 A | 6/2008 |

(Continued)

OTHER PUBLICATIONS

JP-2007166101-A, Jun. 2007 with the English Language machine translation.*

(Continued)

*Primary Examiner* — Metasebia T Retebo
(74) *Attorney, Agent, or Firm* — Pearne & Gordon LLP

(57) ABSTRACT

Provided is a detector circuit that includes: a first transistor that has an alternating current signal input to a base thereof, and that outputs a first detection signal that depends on the alternating current signal from a collector thereof; a second transistor that has the first detection signal input to a base thereof, and that outputs a second detection signal that depends on the first detection signal from a collector thereof; and an alternating current signal path along which the alternating current signal is supplied to the base of the second transistor.

18 Claims, 10 Drawing Sheets

(56) References Cited

FOREIGN PATENT DOCUMENTS

JP 2008-167017 A 7/2008

OTHER PUBLICATIONS

Li, Zhiwen and Chen, Shichang, Electronics Practice, Taiwan University of Science and Technology Library, Dec. 4, 2007, Tiked Books Co., Ltd.

Taiwanese Office Action for Application No. 106113695 dated Dec. 28, 2017.

* cited by examiner

DETECTOR CIRCUIT

This application claims priority of Japanese Patent Application No. 2016-138733 filed on Jul. 13, 2016. The content of this application is incorporated herein by reference in its entirety.

BACKGROUND

The present disclosure relates to detector circuits. Power amplifiers are widely used as circuits that amplify the power of a radio frequency signal when the radio frequency signal is going to be transmitted. In addition, a detector circuit is often used to detect the output power of a radio frequency signal output from a power amplifier.

For example, Japanese Unexamined Patent Application Publication No. 2008-148214 discloses a detector circuit that includes two transistors. Specifically, the detector circuit disclosed in FIG. 1 of the above-cited patent document includes a transistor Tr1 and a transistor Tr2. The collector voltage of the transistor Tr1 changes in accordance with the RF input power, and the collector voltage (detection voltage) of the transistor Tr2 changes in accordance with changes in the collector voltage of the transistor Tr1.

Incidentally, the current that flows through a transistor changes in the form of an exponential function with respect to the voltage supplied to the base thereof. Therefore, the detection voltage would typically change in the form of an exponential function with respect to the RF input power in the detector circuit disclosed in the above-cited patent document as well. In the detector circuit, the detection voltage may be linearly changed with respect to the RF input power.

BRIEF SUMMARY

The present disclosure was made in light of the above-described circumstances and to improve the linearity of a detector circuit.

A detector circuit according to an embodiment of the present disclosure includes: a first transistor that has an alternating current signal input to a base thereof, and that outputs a first detection signal that depends on the alternating current signal from a collector thereof; a second transistor that has the first detection signal input to a base thereof, and that outputs a second detection signal that depends on the first detection signal from a collector thereof; and an alternating current signal path along which the alternating current signal is supplied to the base of the second transistor.

According to the embodiment of the present disclosure, the linearity of a detector circuit can be improved.

Other features, elements, characteristics and advantages of the present disclosure will become more apparent from the following detailed description of the present disclosure with reference to the attached drawings.

DETAILED DESCRIPTION

Figure 1:
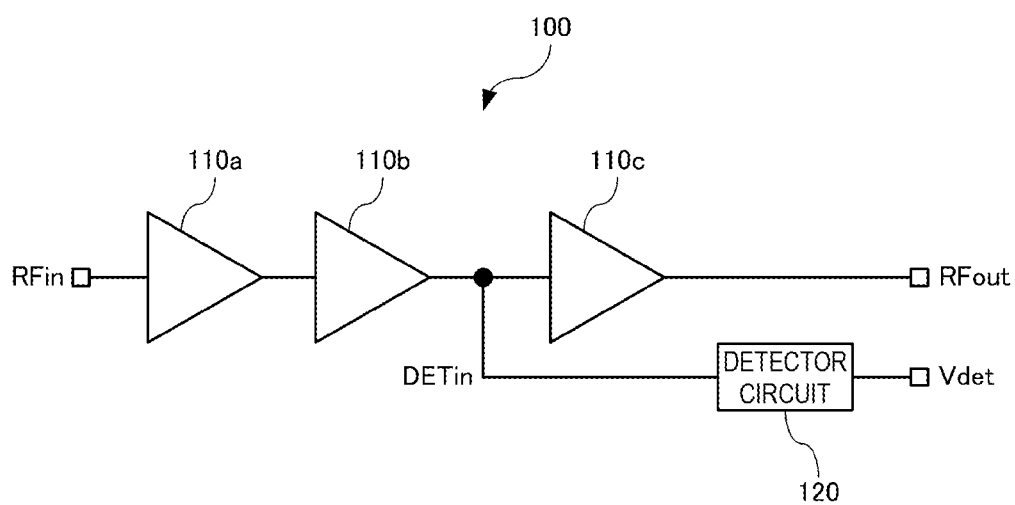
FIG. 1 illustrates the configuration of a power amplification module that includes a detector circuit according to an embodiment of the present disclosure.

Hereafter, embodiments of the present disclosure will be described while referring to the drawings. FIG. 1 illustrates the configuration of a power amplification module that includes a detector circuit according to an embodiment of the present disclosure. A power amplification module 100 includes power amplifiers 110a, 110b and 110c, and a detector circuit 120. The power amplification module 100 amplifies the power of a radio frequency (RF) signal used by a cellular phone or wireless local area network (LAN), for example.

The power amplifiers 110a, 110b and 110c form a three-stage amplification circuit. An RF signal RFin is amplified by the power amplifiers 110a, 110b and 110c, and an amplified signal RFout is output. The power amplification circuit is not limited to having three stages, and may instead have one or two stages, or four or more stages.

The detector circuit 120 outputs a detection voltage Vdet that depends on the power of the amplified signal RFout. In the configuration in FIG. 1, an output signal of the second-stage power amplifier 110b serves as an input signal DETin that is input to the detector circuit 120. The effect of changes in the impedance of a load such as an antenna on the detection voltage Vdet can be suppressed by extracting the input signal DETin from a point between the second-stage power amplifier 110b and the third-stage power amplifier 110c. The input signal DETin input to the detector circuit 120 may be extracted from another point instead. For example, a coupler (directional coupler) may be provided after the third-stage power amplifier 110c, and the input signal DETin may be extracted by the coupler.

For example, the gain of the power amplifier 110a is controlled on the basis of the detection voltage Vdet such that the power of the amplified signal RFout of the power amplification module 100 is at a desired level.

Figure 2:
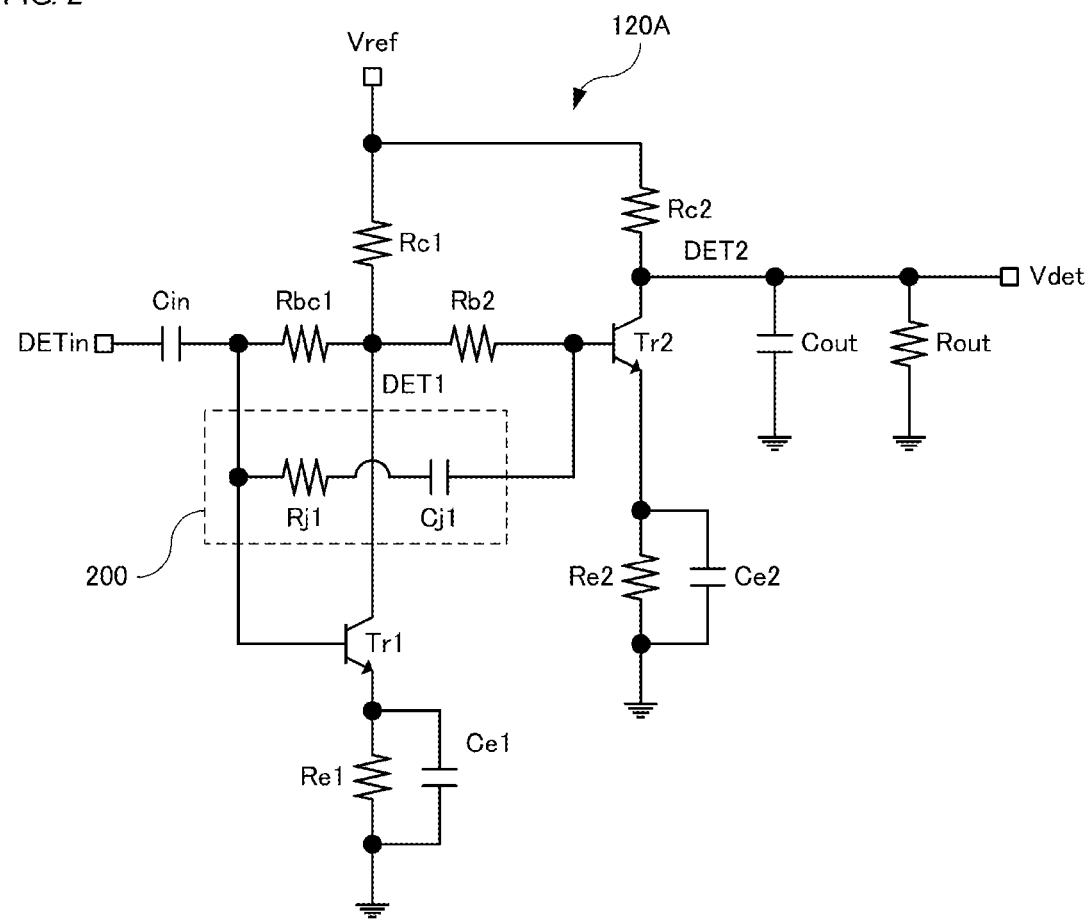
FIG. 2 illustrates an example of the configuration of a detector circuit.

FIG. 2 illustrates an example of the configuration of the detector circuit 120. A detector circuit 120A includes transistors Tr1 and Tr2, resistors Re1, Rbc1, Rc1, Re2, Rc2, Rb2, Rj1 and Rout, and capacitors Cin, Ce1, Ce2, Cj1 and Cout. The serially connected resistor Rj1 and the capacitor Cj1 form an alternating current signal path 200.

The transistor Tr1 (first transistor) and the transistor Tr2 (second transistor) are heterojunction bipolar transistors (HBTs), for example.

The input signal DETin (alternating current signal) is supplied to the base of the transistor Tr1 via the capacitor Cin. The base of the transistor Tr1 is connected to the collector of the transistor Tr1 via the resistor Rbc1 (second resistor). A reference voltage Vref of a prescribed level is supplied to one end of the resistor Rc1, and the other end of the resistor Rc1 is connected to the collector of the transistor Tr1. One end of the resistor Re1 is connected to the emitter of the transistor Tr1, and the other end of the resistor Re1 is grounded. One end of the capacitor Ce1 is connected to the emitter of the transistor Tr1, and the other end of the capacitor Ce1 is grounded. In this connection relationship, the transistor Tr1 outputs a detection signal DET1 (first detection signal) that depends on the input signal DETin (alternating current signal) from the collector thereof.

The capacitor Cin has a function of loosely coupling the output of the power amplifier 110*b* and the detector circuit 120 with each other, and a function of removing a direct-current component of the input signal DETin. Furthermore, the resistor Re1 is provided in order to adjust the bias of the transistor Tr1, and the capacitor Ce1 is provided in order to AC ground the emitter of the transistor Tr1.

The detection signal DET1 is supplied to the base of the transistor Tr2 via the resistor Rb2. In addition, the input signal DETin is supplied to the base of the transistor Tr2 via the capacitor Cin and the alternating current signal path 200. The reference voltage Vref is supplied to one end of the resistor Rc2, and the other end of the resistor Rc2 is connected to the collector of the transistor Tr2. One end of the resistor Re2 is connected to the emitter of the transistor Tr2, and the other end of the resistor Re2 (third resistor) is grounded. One end of the capacitor Ce2 (third capacitor) is connected to the emitter of the transistor Tr2, and the other end of the capacitor Ce2 is grounded. In this connection relationship, the transistor Tr2 outputs a detection signal DET2 (second detection signal) that depends the detection signal DET1 from the collector thereof.

Furthermore, the resistor Re2 is provided in order to adjust the bias of the transistor Tr2, and the capacitor Ce2 is provided in order to AC ground the emitter of the transistor Tr2.

One end of the capacitor Cout is connected to the collector of the transistor Tr2, and the other end of the capacitor Cout is grounded. One end of the resistor Rout is connected to the collector of the transistor Tr2, and the other end of the resistor Rout is grounded. The capacitor Cout and the resistor Rout smooth the detection signal DET2 and output the detection voltage Vdet.

The linearity of the detector circuit 120A is improved as a result of the detector circuit 120A being provided with the alternating current signal path 200. This will be explained below. When the input signal DETin increases, the current flowing through the transistor Tr1 increases, the voltage drop due to the resistor Rc1 increases, and the detection signal DET1 decreases. When the detection signal DET1 decreases, the current flowing through the transistor Tr2 decreases, the voltage drop due to the resistor Rc2 decreases, and the detection signal DET2 increases. As a result, the detection voltage Vdet increases as the input signal DETin increases. Here, the transistors Tr1 and Tr2 have a characteristic that the current flowing therethrough changes exponentially with a change in the base voltage. Therefore, if we were to ignore the alternating current signal path 200, the detection voltage Vdet would exponentially change with a change in the input signal DETin.

In contrast, in the detector circuit 120A, the input signal DETin is supplied to the base of the transistor Tr2 via the alternating current signal path 200. The size of the current that flows through the transistor Tr2, which depends on the input signal DETin, increases as the input signal DETin increases. Therefore, the amount by which the detection signal DET2 is suppressed increases as the input signal DETin increases. Thus, the exponential change of the detection voltage Vdet with a change in the input signal DETin is suppressed, and linearity is improved.

In addition, the detector circuit 120A includes the resistor Rbc1 between the base and the collector of the transistor Tr1. If a short circuit were created by omitting the resistor Rbc1, the base and the collector of the transistor Tr1 would be directly connected to each other and the transistor Tr1 would be equivalent to a diode. In this case, the transistor Tr1 (diode) could be regarded as a variable capacitor having a capacitance value that becomes larger as the input signal DETin increases. Therefore, the input impedance of the detector circuit 120A would also change as the input signal DETin changes. When the input impedance of the detector circuit 120A changes, the impedance of an inter-stage matching network between the power amplifiers 110*b* and 110*c* changes and the characteristics of the power amplification module 100 are degraded.

In contrast, in the detector circuit 120A, the resistor Rbc1 is provided between the base and the collector of the transistor Tr1, and as a result, changes in the input impedance of the detector circuit 120A that occur with changes in the input signal DETin can be suppressed. Therefore, degradation of the characteristics of the power amplification module 100 can be suppressed.

Figure 3:
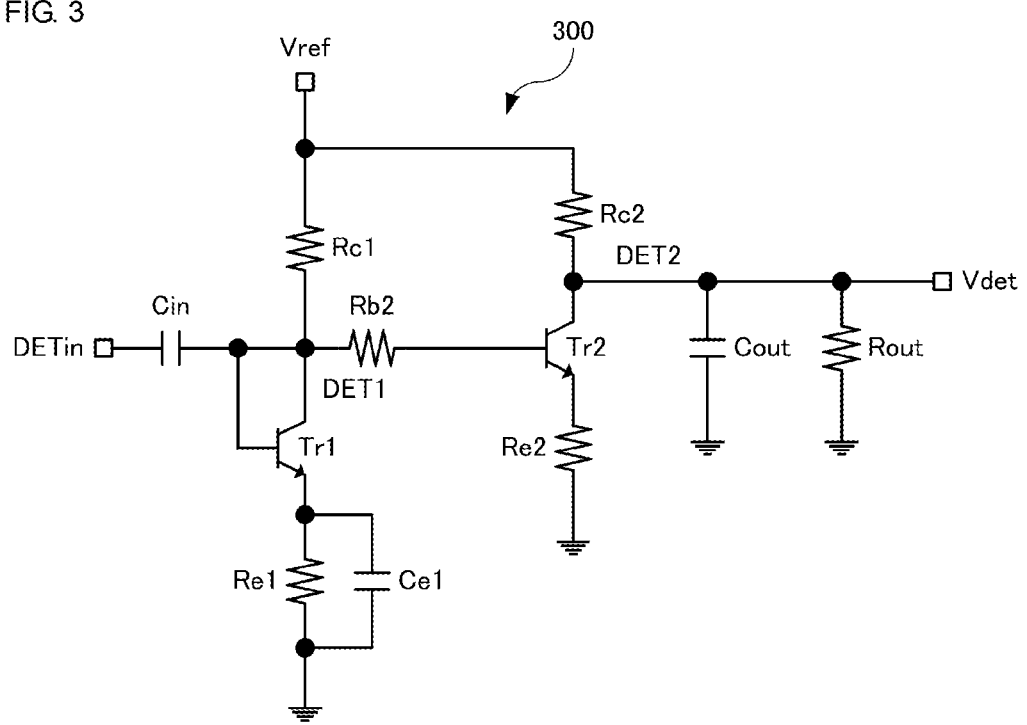
FIG. 3 illustrates the configuration of a detector circuit for comparison with the detector circuit of FIG. 2.

The improvement in the linearity of the detector circuit 120A is illustrated by simulation results. FIG. 3 illustrates the configuration of a detector circuit 300 for comparison with the detector circuit 120A. Elements that are common to the detector circuit 120A are denoted by the same symbols and detailed description thereof is omitted. Compared with the detector circuit 120A, the detector circuit 300 does not include the alternating current signal path 200. In addition, since the detector circuit 300 does not include the alternating current signal path 200, the detector circuit 300 also does not include the capacitor Ce2.

Figure 4A:
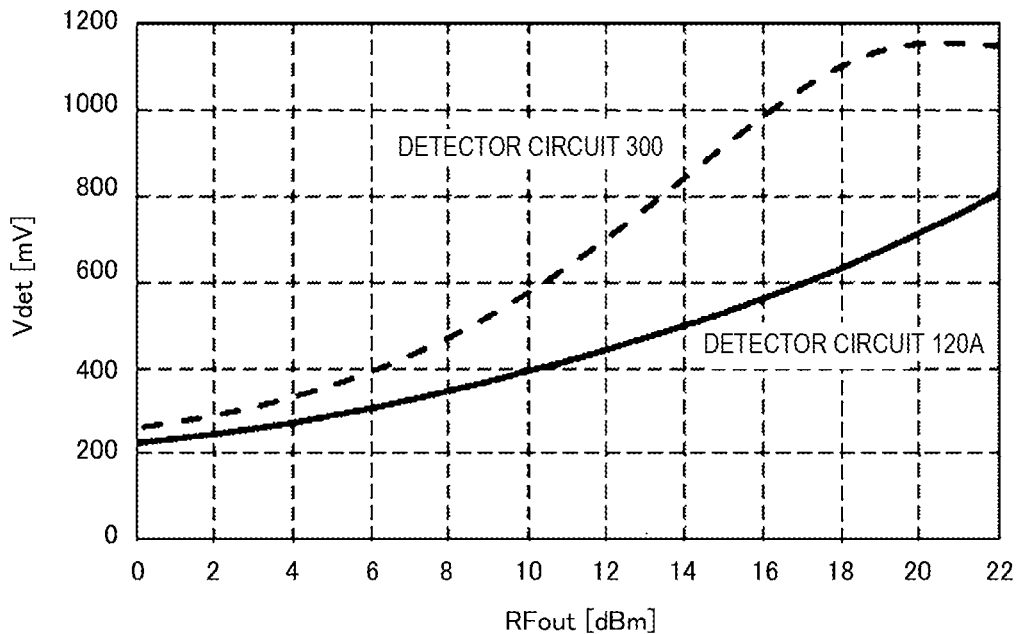
FIG. 4A illustrates simulation results that depict changes in a detection voltage with respect to an amplified signal.

FIG. 4A illustrates simulation results of changes in the detection voltage Vdet with respect to the amplified signal RFout. In FIG. 4A, the horizontal axis represents the power (dBm) of the amplified signal RFout, and the vertical axis represents the detection voltage Vdet (mV). As illustrated in FIG. 4A, it is clear that the detector circuit 120A has better linearity than the detector circuit 300. For example, the detection voltage Vdet increases exponentially in the detector circuit 300, and as a result, the detection voltage Vdet exceeds 1000 mV when the power of the amplified signal RFout is around 16 dBm. In contrast, in the detector circuit 120A, the detection voltage Vdet can be made to be in a range of around 200 to 1000 mV for a range of power of the amplified signal RFout of around 2 to 22 dBm.

Figure 4B:
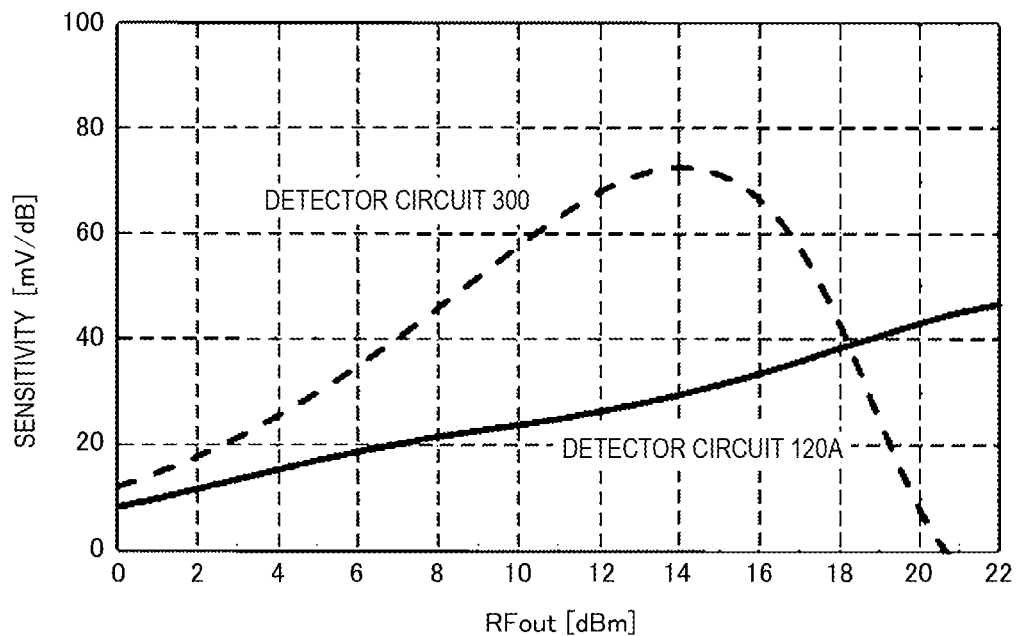
FIG. 4B illustrates simulation results of the sensitivity of the detection voltage with respect to the amplified signal.

FIG. 4B illustrates simulation results of the sensitivity of the detection voltage Vdet with respect to the amplified signal RFout. In FIG. 4B, the horizontal axis represents the power (dBm) of the amplified signal RFout, and the vertical axis represents the sensitivity (mV/dB). As illustrated in FIG. 4B, the sensitivity of the detector circuit 120A is flatter than that of the detector circuit 300. It is clear from FIG. 4B as well that the detector circuit 120A has better linearity than the detector circuit 300.

Figure 5:
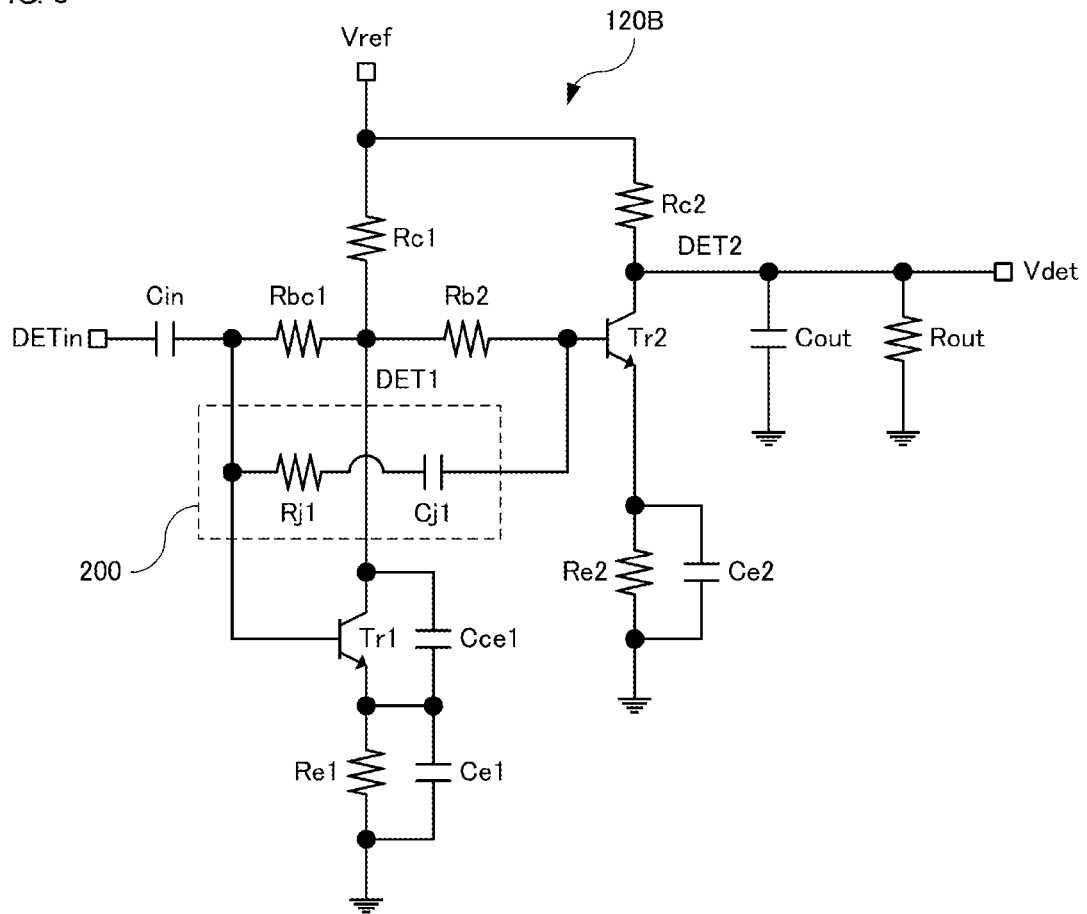
FIG. 5 illustrates another example of the configuration of the detector circuit.

FIG. 5 illustrates another example of the configuration of the detector circuit 120. Elements that are common to the detector circuit 120A are denoted by the same symbols and detailed description thereof is omitted. In addition to the elements of the detector circuit 120A, a detector circuit 120B includes a capacitor Cce1.

One end of the capacitor Cce1 is connected to the collector of the transistor Tr1, and the other end of the capacitor Cce1 is connected to the emitter of the transistor Tr1. By providing the capacitor Cce1 between the collector and the emitter of the transistor Tr1 in the detector circuit 120B, changes in the input impedance of the detector circuit 120B that occur with changes in the input signal DETin can be further suppressed. Therefore, degradation of the characteristics of the power amplification module 100 can be further suppressed.

Figure 6:
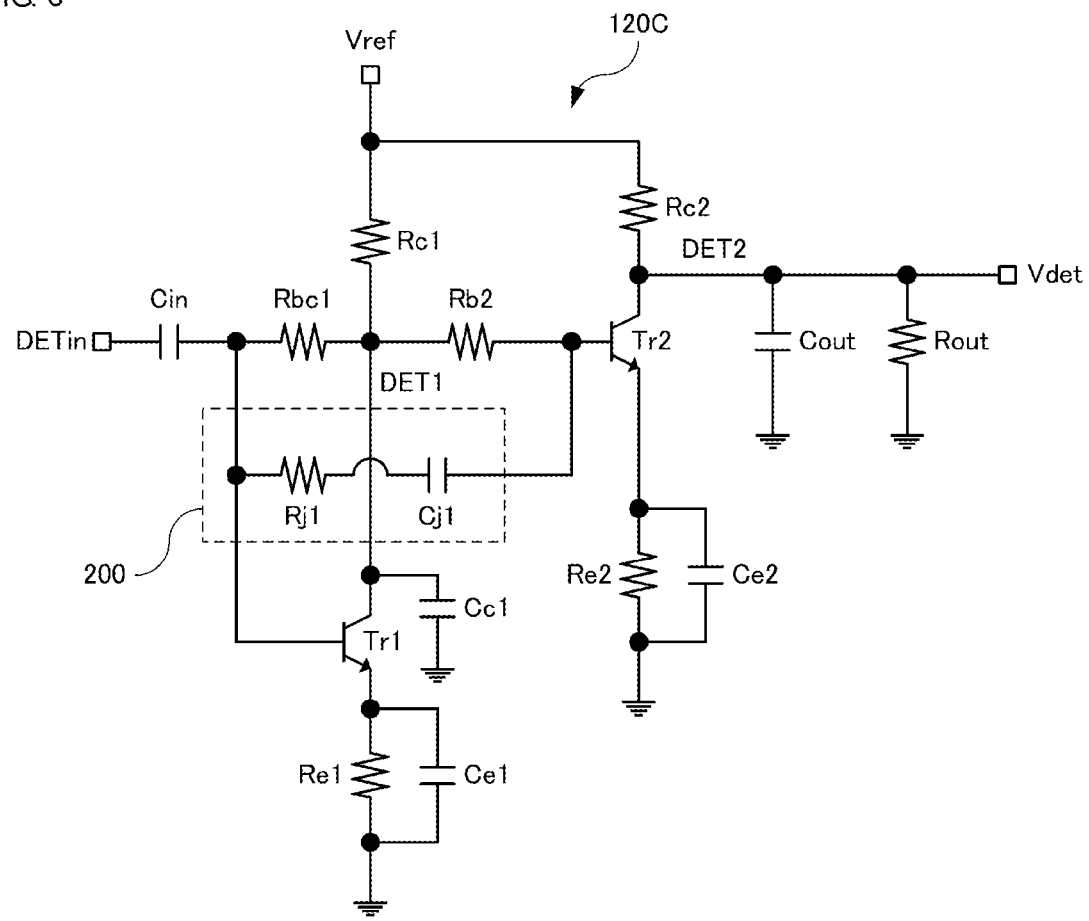
FIG. 6 illustrates another example of the configuration of the detector circuit.

FIG. 6 illustrates another example of the configuration of the detector circuit 120. Elements that are common to the detector circuit 120A are denoted by the same symbols and detailed description thereof is omitted. In addition to the elements of the detector circuit 120A, a detector circuit 120C includes a capacitor Cc1 (second capacitor). One end of the capacitor Cc1 is connected to the collector of the transistor Tr1, and the other end of the capacitor Cc1 is grounded. With this configuration as well, the same effect as with the detector circuit 120B illustrated in FIG. 5 can be obtained.

Figure 7:
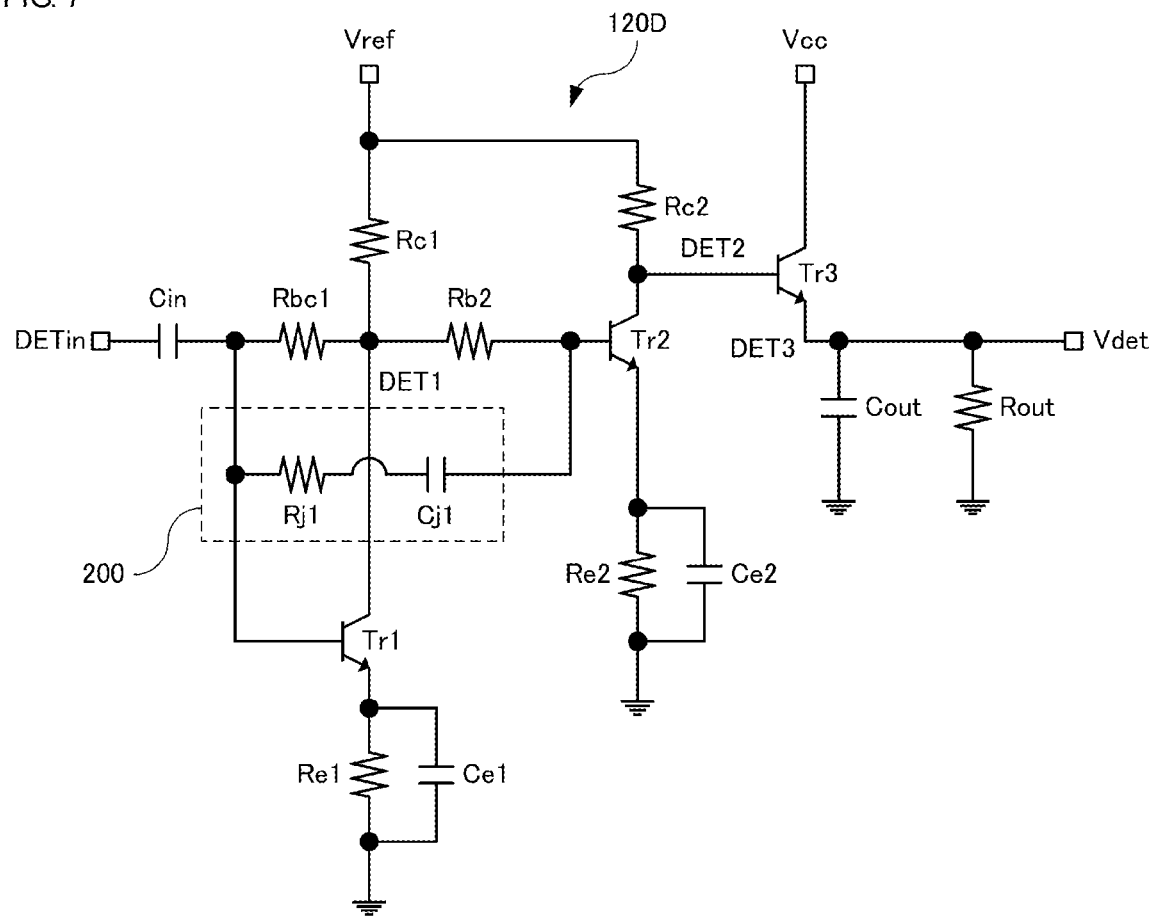
FIG. 7 illustrates another example of the configuration of the detector circuit.

FIG. 7 illustrates another example of the configuration of the detector circuit 120. Elements that are common to the detector circuit 120A are denoted by the same symbols and detailed description thereof is omitted. In addition to the elements of the detector circuit 120A, a detector circuit 120D includes a transistor Tr3.

The transistor Tr3 (third transistor) is a HBT, for example. A power supply voltage Vcc is supplied to the collector of the transistor Tr3, and the detection signal DET2 is input to the base of the transistor Tr3. A detection signal DET3 (third detection signal) is output from the emitter of the transistor Tr3. The detection signal DET3 has a voltage that is lower than the detection signal DET2 by the base-emitter voltage of the transistor Tr3 (for example, 1.3 V). Thus, the transistor Tr3 functions as a buffer. The detection signal DET3 is smoothed by the capacitor Cout and the resistor Rout, and the detection voltage Vdet is output.

In the detector circuit 120A illustrated in FIG. 2, the voltage of the detection signal DET2 changes in accordance with the current flowing through the resistor Rc2. Therefore, when the impedance of the load connected to the output terminal of the detection voltage Vdet changes, the detection signal DET2 changes, and the detection voltage Vdet also changes together with the change in the detection signal DET2.

In contrast, as a result of the detector circuit 120D including the transistor Tr3 (buffer), changes in the detection voltage Vdet that occur with changes in the impedance of the load connected to the output terminal of the detection voltage Vdet can be suppressed compared with the detector circuit 120A.

Figure 8:
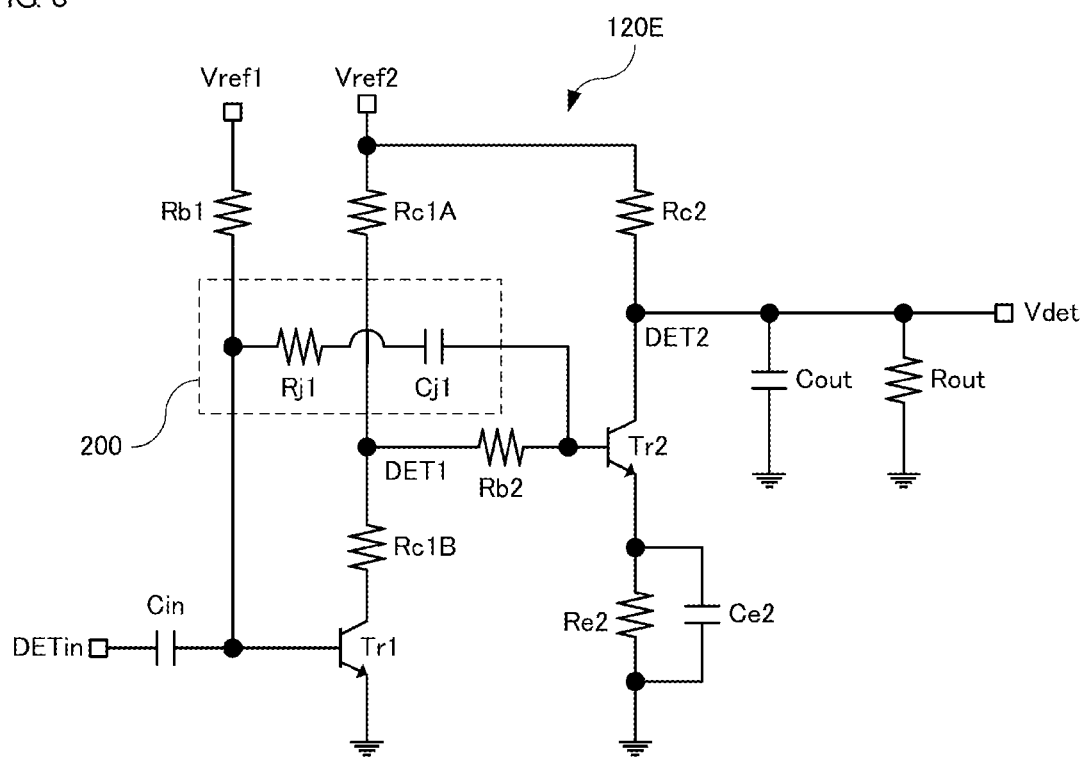
FIG. 8 illustrates another example of the configuration of the detector circuit.

FIG. 8 illustrates another example of the configuration of the detector circuit 120. Elements that are common to the detector circuit 120A are denoted by the same symbols and detailed description thereof is omitted. A detector circuit 120E includes transistors Tr1 and Tr2, resistors Rb1, Rc1A, Rc1B, Rc2, Rb2, Rj1 and Rout, and capacitors Cin, Ce2, Cj1 and Cout.

The input signal DETin (alternating current signal) is supplied to the base of the transistor Tr1 via the capacitor Cin. A reference voltage Vref1 of a prescribed level is supplied to one end of the resistor Rb1, and the other end of the resistor Rb1 is connected to the base of the transistor Tr1. A reference voltage Vref2 of a prescribed level is supplied to one end of the resistor Rc1A, and the other end of the resistor Rc1A is connected to one end of the resistor Rc1B. The other end of the resistor Rc1B is connected to the collector of the transistor Tr1. In this connection relationship, the transistor Tr1 outputs a detection signal DET1 (first detection signal) that depends on the input signal DETin (alternating current signal) from the collector thereof.

The detection signal DET1 is supplied to the base of the transistor Tr2 via the resistor Rb2. In addition, the input signal DETin is supplied to the base of the transistor Tr2 via the capacitor Cin and the alternating current signal path 200. The reference voltage Vref2 is supplied to one end of the resistor Rc2, and the other end of the resistor Rc2 is connected to the collector of the transistor Tr2. One end of the resistor Re2 is connected to the emitter of the transistor Tr2, and the other end of the resistor Re2 is grounded. One end of the capacitor Ce2 is connected to the emitter of the transistor Tr2, and the other end of the capacitor Ce2 is grounded. In this connection relationship, the transistor Tr2 outputs a detection signal DET2 (second detection signal) that depends on the detection signal DET1 from the collector thereof.

One end of the capacitor Cout is connected to the collector of the transistor Tr2, and the other end of the capacitor Cout is grounded. One end of the resistor Rout is connected to the collector of the transistor Tr2, and the other end of the resistor Rout is grounded. The capacitor Cout and the resistor Rout smooth the detection signal DET2, and the detection voltage Vdet is output.

In the thus-configured detector circuit 120E as well, linearity can be improved as a result of the alternating current signal path 200 being provided, similarly to as in the detector circuit 120A illustrated in FIG. 2.

Figure 9A:
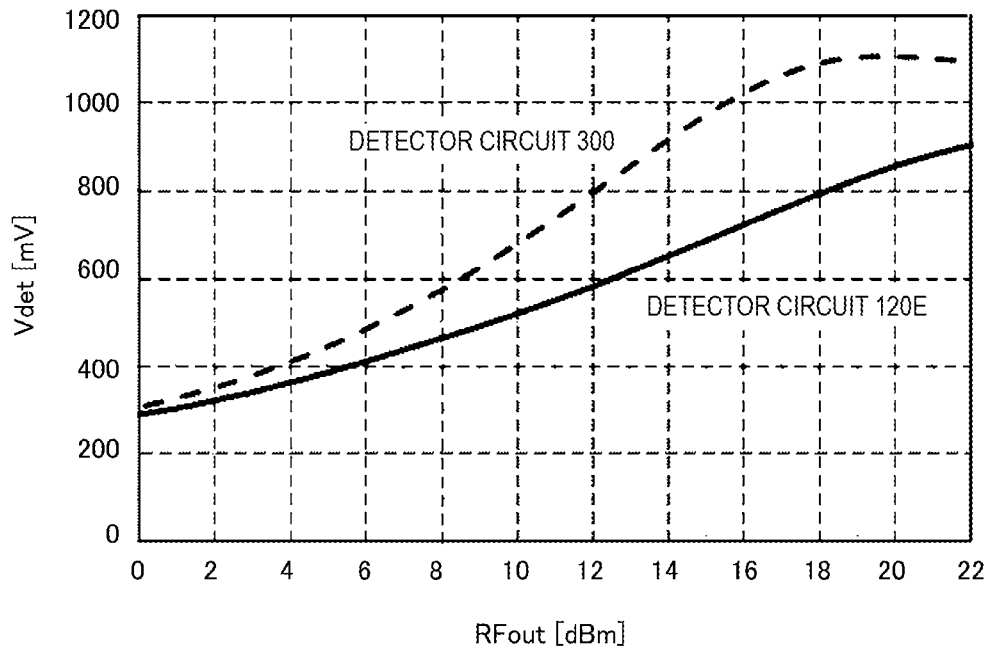
FIG. 9A illustrates simulation results of changes in the detection voltage with respect to the amplified signal.

The improvement in the linearity of the detector circuit 120E is illustrated by simulation results. FIG. 9A illustrates simulation results of changes in the detection voltage Vdet with respect to the amplified signal RFout. In FIG. 9A, the horizontal axis represents the power (dBm) of the amplified signal RFout, and the vertical axis represents the detection voltage Vdet (mV). As illustrated in FIG. 9A, it is clear that the detector circuit 120E has better linearity than the detector circuit 300. For example, the detection voltage Vdet increases exponentially in the detector circuit 300, and as a result, the detection voltage Vdet exceeds 1000 mV when the power of the amplified signal RFout is around 16 dBm. In contrast, in the detector circuit 120A, the detection voltage Vdet can be made to be in a range of 200 to 1000 mV for a range of power of the amplified signal RFout of 2 to 22 dBm.

Figure 9B:
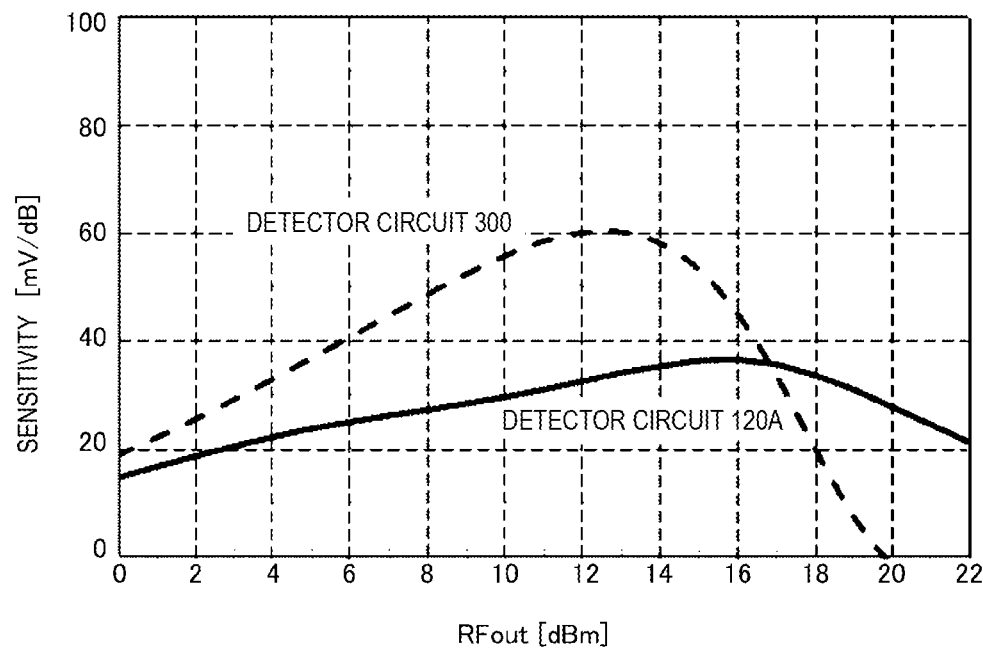
FIG. 9B illustrates simulation results of the sensitivity of the detection voltage with respect to the amplified signal.

FIG. 9B illustrates simulation results of the sensitivity of the detection voltage Vdet with respect to the amplified signal RFout. In FIG. 9B, the horizontal axis represents the power (dBm) of the amplified signal RFout, and the vertical axis represents the sensitivity (mV/dB). As illustrated in FIG. 9B, the sensitivity of the detector circuit 120E is flatter than that of the detector circuit 300. It is clear from FIG. 9B as well that the detector circuit 120E has better linearity than the detector circuit 300.

Figure 10:
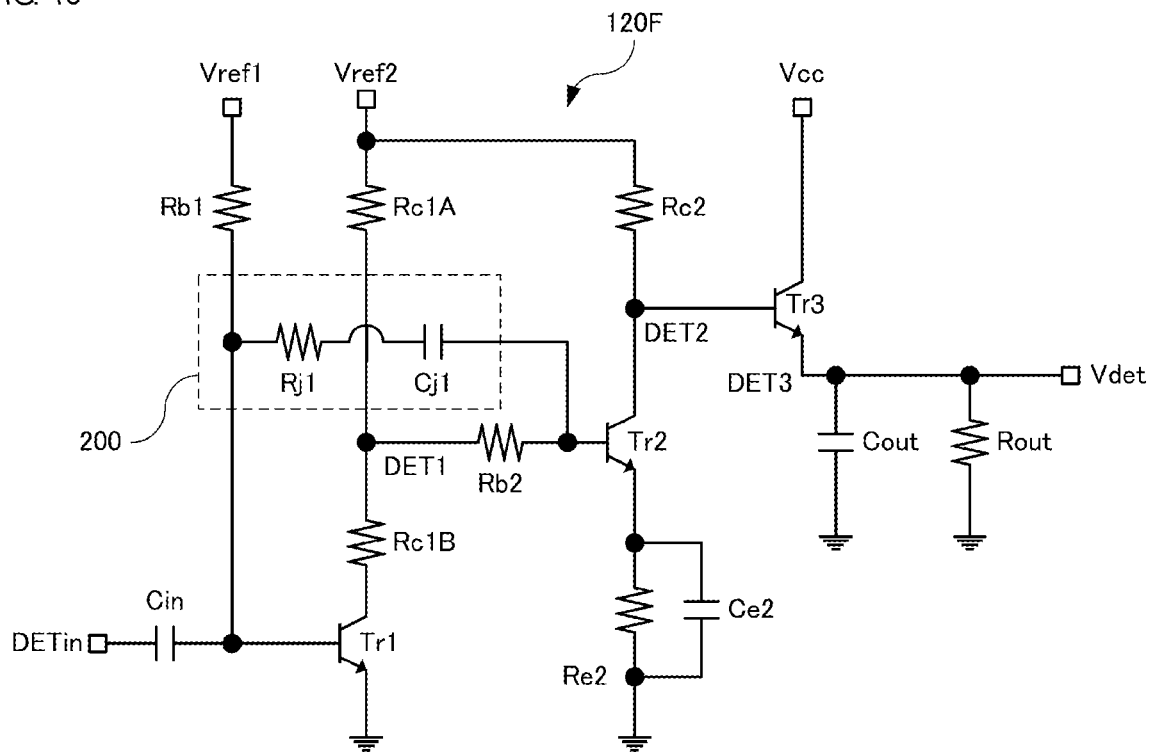
FIG. 10 illustrates another example of the configuration of the detector circuit.

FIG. 10 illustrates another example of the configuration of the detector circuit 120. Elements that are common to the detector circuit 120E are denoted by the same symbols and detailed description thereof is omitted. In addition to the elements of the detector circuit 120E, a detector circuit 120F includes a transistor Tr3. The transistor Tr3 functions as a buffer, similarly to as in the case of the detector circuit 120D illustrated in FIG. 7. As a result of the detector circuit 120F including the transistor Tr3 (buffer), changes in the detection voltage Vdet that occur with changes in the impedance of the load connected to the output terminal of the detection voltage Vdet can be suppressed, similarly to as in the case of the detector circuit 120D.

Exemplary embodiments of the present disclosure have been described above. In the detector circuits 120A to 120F, an alternating current signal (input signal DETin) is input to the base of the transistor Tr1, and the detection signal DET1 that depends on the alternating current signal is output from the collector of the transistor Tr1. In addition, the detection signal DET1 is input to the base of the transistor Tr2, and the detection signal DET2 that depends on the detection signal DET1 is output from the collector of the transistor Tr2. Furthermore, the detector circuits 120A to 120F include the alternating current signal path 200 along which the alternating current signal (input signal DETin) is supplied to the base of the transistor Tr2.

In the detector circuits 120A to 120F, the input signal DETin is supplied to the base of the transistor Tr2 via the alternating current signal path 200. The size of the current that flows through the transistor Tr2, which depends on the input signal DETin, increases as the input signal DETin increases. Therefore, the amount by which the detection signal DET2 is suppressed increases as the input signal DETin increases. Thus, the exponential change in the detection voltage Vdet that occurs with a change in the input signal DETin is suppressed, and linearity is improved.

The alternating current signal path 200 can be formed of the resistor Rj1 (first resistor) and the capacitor Cj1 (first capacitor) connected in series with each other, for example.

In addition, the detector circuits 120A to 120D each include the resistor Rbc1, which is provided between the base and the collector of the transistor Tr1. As a result, changes in the input impedance that occur with changes in the input signal DETin can be suppressed. Therefore, degradation of the characteristics of the power amplification module 100 can be suppressed.

Furthermore, the detector circuit 120B includes the capacitor Cce1 (second capacitor), which is provided between the collector and emitter of the transistor Tr1. Similarly, the detector circuit 120C includes the capacitor Cc1, which is provided between the collector of the transistor Tr1 and the ground. Thus, as a result of a capacitor being provided that has one end connected to the collector of the transistor Tr1, changes in the input impedance that occur with changes in the input signal DETin can be further suppressed. Therefore, degradation of the characteristics of the power amplification module 100 can be further suppressed.

Furthermore, the detector circuits 120A to 120F each include the resistor Re2 and the capacitor Ce2, which are connected in parallel with each other between the emitter of the transistor Tr2 and the ground. As a result, the resistor Re2 adjusts the bias of the transistor Tr2, and the capacitor Ce2 AC-grounds the emitter of the transistor Tr2.

In addition, the detector circuits 120D and 120F each include the transistor Tr3 that has the detection signal DET2 input to the base thereof and that outputs the detection signal DET3 that depends on the detection signal DET2 from the emitter thereof. Thus, changes in the detection voltage Vdet that occur with changes in the impedance of the load connected to the output terminal of the detection voltage Vdet can be suppressed by providing the transistor Tr3 (buffer).

The purpose of the embodiments described above is to enable easy understanding of the present invention, and the embodiments are not to be interpreted as limiting the present invention. The present invention can be modified or improved without departing from the gist of the present invention, and equivalents to the present invention are also included in the scope of the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A detector circuit comprising:
    a first transistor, wherein an alternating current signal is input to a base of the first transistor via a direct-current component removing capacitor, and a first detection signal that depends on the alternating current signal is output from a collector of the first transistor;
    a second transistor, wherein the first detection signal is input to a base of the second transistor, and a second detection signal that depends on the first detection signal is output from a collector of the second transistor; and
    an alternating current signal path along which the alternating current signal is supplied to the base of the second transistor, wherein the alternating current signal path is different from a path along which the first detection signal is transmitted, wherein the alternating current signal path comprises a first resistor and a first capacitor connected in series with each other, and the alternating current signal path bypasses the collector of the first transistor.

2. The detector circuit according to claim 1, further comprising:
    a second resistor, wherein one end of the second resistor is connected to the base of the first transistor, and another end of the second resistor is connected to the collector of the first transistor.

3. The detector circuit according to claim 2, further comprising:
    a second capacitor, wherein one end of the second capacitor is connected to the collector of the first transistor, and another end of the second capacitor is connected to ground or an emitter of the first transistor.

4. The detector circuit according to claim 1, further comprising:
    a third resistor; and
    a third capacitor,
    wherein one end of the third resistor is connected to an emitter of the second transistor, and another end of the third resistor is grounded, and
    one end of the third capacitor is connected to the emitter of the second transistor, and another end of the third capacitor is grounded.

5. The detector circuit according to claim 1, further comprising:
a third transistor, wherein the second detection signal is input to a base of the third transistor, and a third detection signal that depends on the second detection signal is output from an emitter of the third transistor.

6. The detector circuit according to claim 5, wherein a voltage of the third detection signal is less than a voltage of the second detection signal.

7. The detector circuit according to claim 1, wherein a first reference voltage is supplied to the collector of the first transistor and the collector of the second transistor.

8. The detector circuit according to claim 5,
wherein a first reference voltage is supplied to the collector of the first transistor and the collector of the second transistor, and
wherein a power supply voltage is supplied to a collector of the third transistor.

9. The detector circuit according to claim 1,
wherein a first reference voltage is supplied to the base of the first transistor, and
wherein a second reference voltage is supplied to the collector of the first transistor and the collector of the second transistor.

10. The detector circuit according to claim 9,
wherein the alternating current signal path comprises a first resistor and a first capacitor connected in series with each other.

11. The detector circuit according to claim 9, further comprising:
a second resistor, wherein one end of the second resistor is connected to the base of the first transistor, and another end of the second resistor is connected to the collector of the first transistor.

12. The detector circuit according to claim 11, further comprising:
a second capacitor, wherein one end of the second capacitor is connected to the collector of the first transistor, and another end of the second capacitor is connected to ground or an emitter of the first transistor.

13. The detector circuit according to claim 9, further comprising:
a third resistor; and
a third capacitor,
wherein one end of the third resistor is connected to an emitter of the second transistor, and another end of the third resistor is grounded, and
one end of the third capacitor is connected to the emitter of the second transistor, and another end of the third capacitor is grounded.

14. The detector circuit according to claim 9, further comprising:
a third transistor, wherein the second detection signal is input to a base of the third transistor, and a third detection signal that depends on the second detection signal is output from an emitter of the third transistor.

15. The detector circuit according to claim 14, wherein a voltage of the third detection signal is less than a voltage of the second detection signal.

16. The detector circuit according to claim 9,
wherein a power supply voltage is supplied to a collector of the third transistor.

17. The detector circuit according to claim 1, wherein the base of the first transistor and the collector of the first transistor are not short-circuited.

18. The detector circuit according to claim 1, wherein the alternating current signal is supplied to the base of the second transistor via the direct-current component removing capacitor, the first resistor, and the first capacitor connected in series with each other.

* * * * *